United States Patent
Li et al.

(10) Patent No.: US 10,709,046 B2
(45) Date of Patent: Jul. 7, 2020

(54) ELECTROMAGNETIC SHIELDING MATERIAL, A CONNECTOR SHIELDING SHELL AND A CABLE

(71) Applicant: LUXSHARE PRECISION INDUSTRY CO., LTD., Shenzhen (CN)

(72) Inventors: Huabing Li, Shenzhen (CN); Hong Chi, Shenzhen (CN)

(73) Assignee: LUXSHARE PRECISION INDUSTRY CO., LTD. (CN)

( * ) Notice: Subject to any disclaimer, the term of this patent is extended or adjusted under 35 U.S.C. 154(b) by 35 days.

(21) Appl. No.: 15/951,348

(22) Filed: Apr. 12, 2018

(65) Prior Publication Data
US 2018/0303013 A1 Oct. 18, 2018

(30) Foreign Application Priority Data
Apr. 13, 2017 (CN) .......................... 2017 1 0239194

(51) Int. Cl.
| | |
|---|---|
| *H05K 9/00* | (2006.01) |
| *H01R 13/6599* | (2011.01) |
| *H01B 9/02* | (2006.01) |
| *H01B 1/20* | (2006.01) |
| *H01B 11/10* | (2006.01) |

(52) U.S. Cl.
CPC ............. *H05K 9/0088* (2013.01); *H01B 1/20* (2013.01); *H01B 9/02* (2013.01); *H01R 13/6599* (2013.01); *H05K 9/0084* (2013.01); *H05K 9/0098* (2013.01); *H01B 11/1058* (2013.01)

(58) Field of Classification Search
CPC .. H05K 9/0088; H05K 9/0084; H05K 9/0098; H01B 1/20; H01B 11/1058; H01R 13/6599

See application file for complete search history.

(56) References Cited

U.S. PATENT DOCUMENTS

| | | | |
|---|---|---|---|
| 10,297,368 B2 * | 5/2019 | Chen ...................... | H01B 11/20 |
| 2016/0020002 A1 * | 1/2016 | Feng ..................... | H01B 11/20 |
| | | | 174/103 |

FOREIGN PATENT DOCUMENTS

| | | | |
|---|---|---|---|
| CN | 104210168 A | * | 12/2014 |
| CN | 104210168 A | | 12/2014 |
| CN | 204102593 U | | 1/2015 |
| CN | 105199565 A | * | 12/2015 |
| CN | 105199565 A | | 12/2015 |

OTHER PUBLICATIONS

Non-English Chinese Office Action for Application No. 201710239194.4, dated Jun. 22, 2018.

* cited by examiner

*Primary Examiner* — Timothy J Thompson
*Assistant Examiner* — Amol H Patel
(74) *Attorney, Agent, or Firm* — Schmeiser, Olsen & Watts, LLP

(57) ABSTRACT

Provided is an electromagnetic shielding material, a connector shielding shell and a cable, which includes the following raw materials in part by weight: 1 part of surfactant, 1 part of coupling agent, 1 part of reductant-oxidant, 1-3 part(s) of dispersant, 5 parts of silver, 1 part of carbon, 55 parts of graphene oxide, 40 parts of thermoplastic elastomer and 0.2-1 part of lubricant, which has the advantages of good shielding efficiency, good corrosion resistance, low weight, low material costs, high degree of automation, etc.

12 Claims, 4 Drawing Sheets

ELECTROMAGNETIC SHIELDING MATERIAL, A CONNECTOR SHIELDING SHELL AND A CABLE

CROSS-REFERENCE TO RELATED APPLICATION

This application claims priority to Chinese Application No. 201710239194.4, having a filing date of Apr. 13, 2017, the entire contents of which are hereby incorporated by reference.

FIELD OF TECHNOLOGY

The following relates to an electromagnetic shielding material, a connector shielding shell and a cable.

BACKGROUND

Metal or alloy is usually used as an electromagnetic shielding material in electronics industry. However, the more extensive use of electromagnetic shielding materials is limited due to their shortcomings such as high density, complex process, poor hand-feel, etc.

Therefore, there is a need to develop an electromagnetic shielding material with excellent comprehensive performance.

SUMMARY

An aspect relates to an electromagnetic shielding material, a connector shielding shell and a cable which have the advantages of good shielding efficiency, corrosion resistance and antistatic property and low material costs, etc.

According to exemplary embodiments of the invention, an electromagnetic shielding material is prepared from the following raw materials in part by weight: 1 part of surfactant, 1 part of coupling agent, 1 part of reductant-oxidant (redox agent), 1-3 part(s) of dispersant, 5 parts of silver, 1 part of carbon, 55 parts of graphene oxide, 40 parts of thermoplastic elastomer and 0.2-1 part of lubricant.

According to exemplary embodiments of the invention, an electromagnetic shielding material is prepared from the following raw materials in part by weight: 1 part of surfactant, 1 part of coupling agent, 1 part of reductant-oxidant, 1-3 part(s) of dispersant, 5 parts of silver, 1 part of carbon, 47-50 parts of graphene oxide, 40 parts of thermoplastic elastomer and 0.2-1 part of lubricant.

According to exemplary embodiments of the invention, the surfactant includes, but is not limited to, sodium dodecyl benzene sulfonate, sodium dodecyl sulfate, hexadecyl trimethyl ammonium bromide, butynediol diethoxy ether or polyvinylpyrrolidone.

According to exemplary embodiments of the invention, the coupling agent includes, but is not limited to, diisopropyl bis(acetylacetonato)titanate, 3-aminopropyltrimethoxysilane or diethylaminomethyltriethoxysilane.

According to exemplary embodiments of the invention, the oxidant includes, but is not limited to, ferric trichloride or ammonium persulfate; and the reductant includes, but is not limited to, formaldehyde, ethylenediamine, sodium borohydride or glucose.

According to exemplary embodiments of the invention, the dispersant includes, but is not limited to, polyethylene glycol octylphenyl ether, ethylene bis-stearamide or organic silicone oil. The amount of dispersant can be, for example, but not limited to, 1, 1.5, 2, 2.5 or 3 part(s) by weight.

According to exemplary embodiments of the invention, the thermoplastic elastomer includes, but is not limited to, urethane, olefin, amide, diene, or organic silicon thermoplastic elastomer.

According to exemplary embodiments of the invention, the lubricant includes, but is not limited to, silicone, pentaerythritol stearate, calcium stearate or magnesium stearate. The amount of lubricant can be, for example, but not limited to, 0.2, 0.3, 0.4, 0.5, 0.6, 0.7, 0.8, 0.9, or 1 part by weight.

According to exemplary embodiments of the invention, a connector shielding shell is made from the electromagnetic shielding material described above. The connector shielding shell is used to package a connector, especially an electrical connector. Embodiments of the connector shielding shell can effectively shield the electromagnetic radiation generated by the connector packaged therein.

According to exemplary embodiments of the invention, a cable comprises an outer sheath, an inner sheath and an outer shielding layer disposed between the outer sheath and the inner sheath; the inner sheath further comprises a differential signal cable in its interior; and the outer shielding layer employs plastic materials synthesized by using graphene oxide.

The shielding material, the connector shielding shell and the outer shielding layer of a cable of embodiments of the present invention are made from graphene oxide, and have the advantages of good shielding efficiency, corrosion resistance and antistatic property and low material costs, etc.

BRIEF DESCRIPTION

Some of the embodiments will be described in detail, with reference to the following figures, wherein like designations denote like members, wherein.

REFERENCE NUMERALS AND SIGNS

Figure 1:
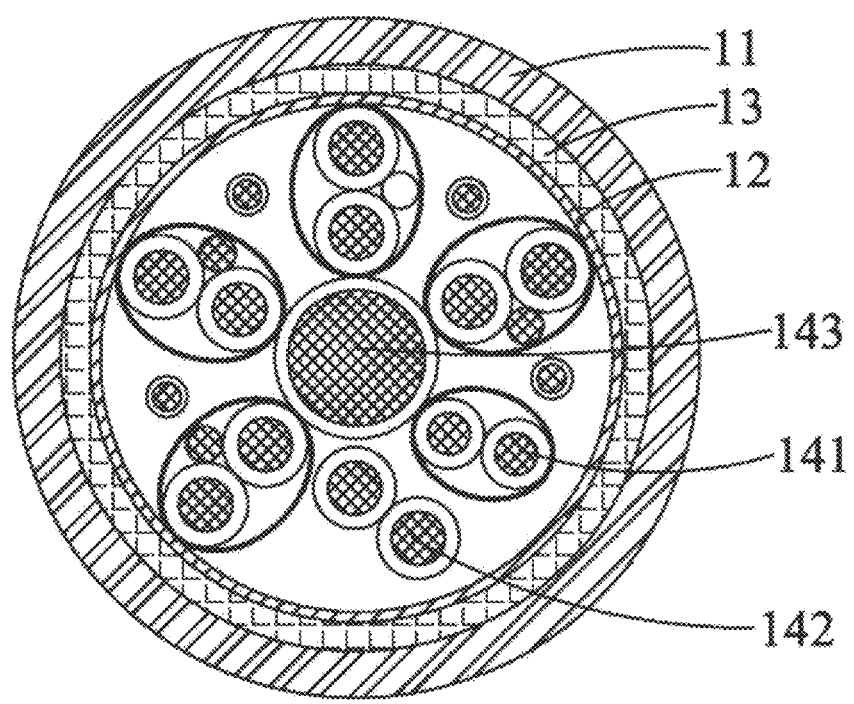
FIG. 1 is a cross-sectional schematic view of a cable, in accordance with embodiments of the present invention.

10—USB Type-C cable; 11—outer sheath; 12—inner sheath; 13—outer shielding layer; 141—differential signal cable; 142—power cable; 143—control cable.

DETAILED DESCRIPTION

In part by weight, the electromagnetic shielding material of embodiments of the present invention is composed of:

(1) 1 part of surfactant. The molecular structures of surfactants are amphiphilic, with one end thereof being hydrophilic group and the other end being hydrophobic group. Surfactants are molecules formed by two distinct types of particles: one is extremely lipophilic and the other one is extremely hydrophilic. After being dissolved in water, the surfactants can reduce the surface tension of water and enhance the solubility of organic compounds. There are a wide range of surfactants (cationic, anionic, non-ionic and amphoteric), which can provide various functions for specific applications. Examples of the surfactant include, but are not limited to, sodium dodecyl benzene sulfonate, sodium dodecyl sulfate, hexadecyl trimethyl ammonium bromide, butynediol diethoxy ether or polyvinylpyrrolidone.

(2) 1 part of coupling agent. Coupling agents are a class of organosilicon compounds with special structures. They have both a reactive group capable of binding with inorganic materials such as glasses, cements, metals and the like, and a reactive group capable of binding with organic materials such as synthetic resins and the like in their molecules. Commonly used theories are chemical bonding theory, surface infiltration theory, deformation layer theory, restraint layer theory, etc. When a coupling agent is used as a surface modifier and inorganic filler for filling plastics, the dispersibility and adhesiveness thereof can be improved. Examples of the coupling agent include, but are not limited to, diisopropyl bis(acetylacetonato)titanate, 3-aminopropyltrimethoxysilane or diethylaminomethyltriethoxysilane.

(3) 1 part of reductant-oxidant. The essence of redox reaction is the gain or loss of electrons or the shift of shared electron pairs. Redox reaction is one of the three basic reactions in chemical reactions (the other two are (Lewis) acid-base reaction and radical reaction). Combustion, respiration and photosynthesis in nature, as well as chemical batteries, metal smelting and rocket launches in production and life process etc. are closely related to redox reaction. Examples of the oxidant include, but are not limited to, ferric trichloride or ammonium persulfate, and examples of the reductant include, but are not limited to, formaldehyde, ethylenediamine, sodium borohydride or glucose.

(4) 1-3 part(s) of dispersant. Dispersants are interfacial agents that exhibiting both two opposite properties, i.e. lipophilic property and hydrophilic property, in their molecules. They can uniformly disperse the solid and liquid particles of inorganic and organic pigments that are difficult to dissolve in liquid, while preventing sedimentation and agglomeration of the particles. They are amphipathic reagents needed to form stable suspensions. Examples of dispersants include, but are not limited to, polyethylene glycol octylphenyl ether, ethylene bis-stearamide or organic silicone oil.

(5) 5 parts of silver (Ag). Silver has long-lasting oxidation resistance and glossiness and can enhance the conductive properties.

(6) 1 part of carbon (C). Carbon materials are widely used in cable industry, plastics industry and other various fields and have advantages of good dispersion, high purity, anti-UV, anti-corrosion, etc.

(7) 55 parts of graphene oxide (GO). Graphene oxide is a novel carbon material with excellent performances, having relative high specific surface area and abundant functional groups on surface. Graphene oxide composite materials include polymer type composite materials and inorganic substance type composite materials, and have a wide range of applications.

(8) 40 parts of thermoplastic elastomer (SEBS), which can be used to change the appearance and softness of the electromagnetic shielding material of embodiments of the present invention. Examples of thermoplastic elastomers include, but are not limited to, urethane, olefin, amide, diene or organic silicon thermoplastic elastomer.

(9) 0.2-1 part of lubricant, for adjusting the formulas of the production. Examples of lubricants include, but are not limited to, silicone, pentaerythritol stearate, calcium stearate, or magnesium stearate.

(10) 0.2 part of other ingredients, for adjusting the formulas according to specific use of the electromagnetic shielding material of embodiments of the present invention.

In another embodiment, the electromagnetic shielding material of embodiments of the present invention is composed of, in part by weight, 1 part of surfactant, 1 part of coupling agent, 1 part of reductant-oxidant, 1-3 part(s) of dispersant, 5 parts of silver (Ag), 1 part of carbon (C), 47-50 parts of graphene oxide (GO), 40 parts of thermoplastic elastomer (SEBS), 0.2-1 part of lubricant, and 0.2 part of other ingredients.

The production process of the electromagnetic shielding material of embodiments of the present invention is as follows: batching according to materials in part by weight described above, feeding, dispersing with a disperser, mixing with a mixer, kneading with a kneader, extruding with an extruder, pulling with a pulling machine, water-cooling, air-drying, pelletizing, vibration screening, delivery, packaging and storing.

Graphene has low density and is softness, has good thermal stability and chemical stability, high electrical conductivity, and is capable of reflecting electromagnetic waves, wherein the higher the frequency, the higher the reflectivity, and has good shielding efficiency for high frequency (30 MHZ~5 GHZ) electromagnetic radiation. However, graphene has relatively low shielding efficiency for low-frequency electromagnetic waves because of anti-magnetic properties thereof. Whereas, magnetic metals can absorb electromagnetic radiation and can adjust the electrical and magnetic properties of composite materials. With regard to the electromagnetic shielding material of embodiments of the present invention, since the graphene oxide combines the dual advantages of graphene and magnetic metals, it has good shielding efficiency over a wide frequency range, allowing it to have broader application prospects.

The shielding efficiency of the electromagnetic shielding materials of embodiments of the present invention is good, obviously better than black carbon and slightly inferior to pure silver, but in a wide frequency range, its shielding effect is equivalent to pure silver. The corrosion resistance of the electromagnetic shielding materials of embodiments of the present invention is good. Most electromagnetic shielding materials are copper, aluminum and alloy copper products, and silver and silver-plated filler can produce electrical coupling which accelerates the corrosion of outdoor products. However, graphene oxide-containing shielding materials have good compatibility. The electromagnetic shielding materials of embodiments of the present invention have low costs. The price of graphene oxide is ⅓ to ¼ of silver materials, cheaper than pure silver.

As shown in FIG. 1, the cable 10 of embodiments of the present invention is a USB Type-C cable, which comprises an outer sheath 11, an inner sheath 12 and an outer shielding layer 13 disposed between the outer sheath 11 and the inner sheath 12. The inner sheath 12 further comprises a differential signal cable 141, a power cable 142 and a control cable 143 in its interior.

The outer sheath 11 employs conventional design, usually made from PVC, TPE or TPU materials.

The inner sheath 12 employs aluminum foil or mylar.

The outer shielding layer 13 employs plastic materials synthesized by using graphene oxide. Specifically, the outer shielding layer 13 is made from the following raw materials in part by weight: 1 part of surfactant, 1 part of coupling agent, 1 part of reductant-oxidant, 1-3 part(s) of dispersant, 5 parts of silver, 1 part of carbon, 55 parts of graphene oxide, 40 parts of thermoplastic elastomer, and 0.2-1 part of lubricant.

In another embodiment, the outer shielding layer 13 employs plastic materials synthesized by using graphene oxide. Specifically, the outer shielding layer 13 is made from the following raw materials in part by weight: 1 part of surfactant, 1 part of coupling agent, 1 part of reductant-oxidant, 1-3 part(s) of dispersant, 5 parts of silver, 1 part of carbon, 47-50 parts of graphene oxide, 40 parts of thermoplastic elastomer, and 0.2-1 part of lubricant.

The differential signal cable 141, the power cable 142 and the control cable 143 comprise a conductor and an insulator wrapping the conductor, respectively. The differential signal cable 141 further comprises an inner shielding layer (aluminum foil or copper foil) that wraps the insulator.

The outer shielding layer 13 of the cable 10 of embodiments of the present invention has advantages of good shielding efficiency and corrosion resistance, and low material costs, etc., due to the use of graphene oxide.

In other embodiments, the electromagnetic shielding material of embodiments of the present invention can also be made into a connector shielding shell, which has advantages of good shielding efficiency and corrosion resistance, antistatic property and low material costs, etc.

Performance Testing

Figure 2:
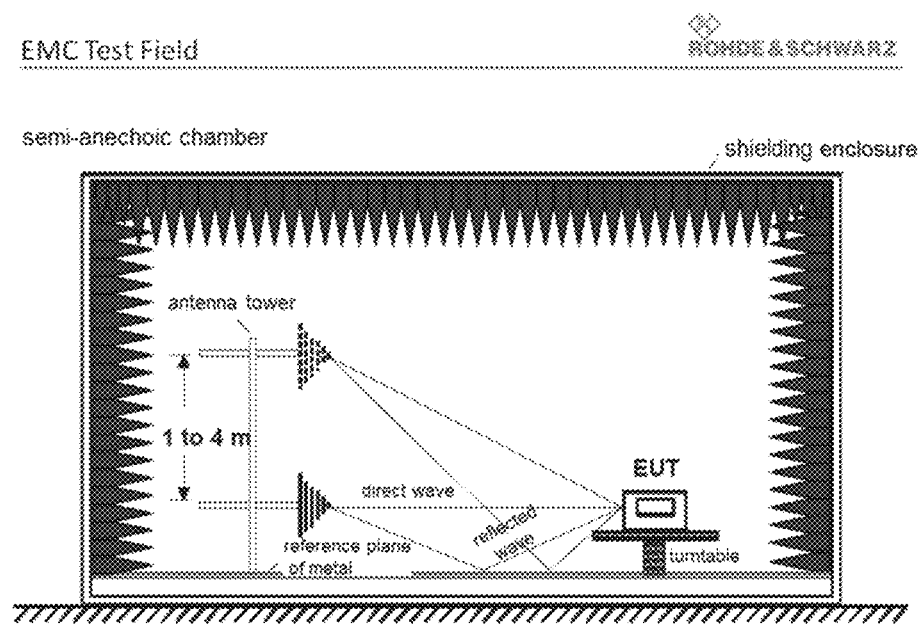
FIG. 2 is a schematic view of an EMC test field, in accordance with embodiments of the present invention.
Figure 3:
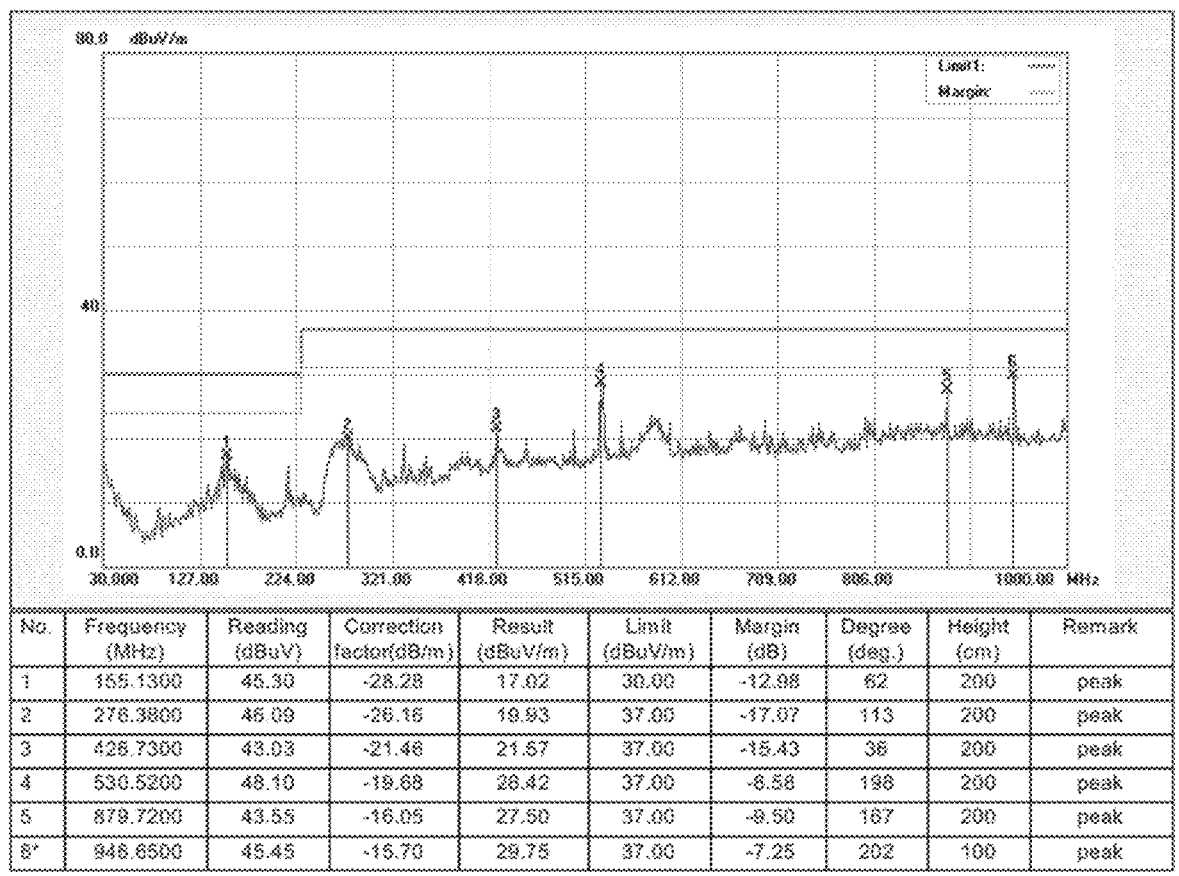
FIG. 3 shows data of the radiated emission test of the Type-C mobile phone USB cable, in accordance with embodiments of the present invention in a horizontal direction.
Figure 4:
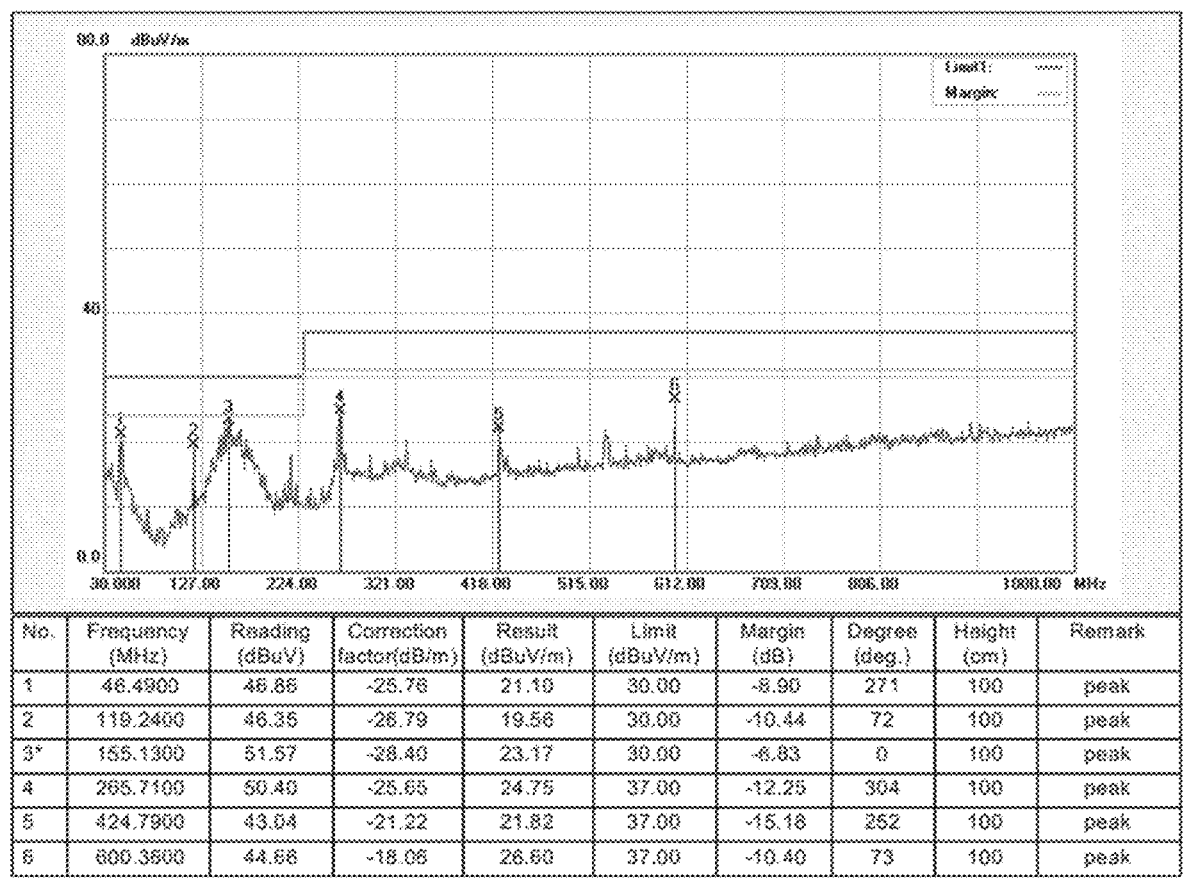
FIG. 4 shows data of the radiated emission test of the Type-C mobile phone USB cable, in accordance with embodiments of the present invention in a vertical direction.

According to the present disclosure, the Type-C mobile phone USB cable is subjected to a radiated emission. A product is measured in a closed semi-anechoic chamber, as shown in FIG. 2. During the test, the electronic equipment needs to operate and transfer data normally. A Type-C mobile phone USB cable is measured in this test, therefore, in the actual test, a mobile phone need to be connected to a computer via the USB cable, charging the mobile phone by the computer, and transferring data between the computer and the mobile phone so that the cable is in working mode, and the radiation interference signal from the whole group of devices is received through the receiving antenna in the chamber. During the test, the turntable on which the test equipment is placed will rotate constantly to allow the antenna to receive the radiated interference signals in all directions. The antenna also rotates in horizontal and vertical directions, so that two sets of data, in horizontal (FIG. 3) and vertical (FIG. 4) directions, are obtained. Test standards refer to the European Union EN55022 standard, in which the test frequency is up to 1 GHz and the distance between the antenna and the measured object is 10M. The performance data of the Type-C mobile phone USB cable of the present disclosure is obtained, as shown in FIG. 3 and FIG. 4, in which the upper line is the limit defined by EN55022, and exceeding it means Fail, the lower line is obtained by taking the limit as benchmark and making it stricter by 6 dB Margin. In general, requirements for margin vary among different products, and −3 dB, −4 dB, or −6 dB have already been relatively stringent requirements. From the measured data, whether scanned vertically or horizontally, the Type-C mobile phone USB cable of the present disclosure meets the requirement for margin of −6 dB.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. An electromagnetic shielding material comprising raw materials in part by weight: 1 part of surfactant, 1 part of coupling agent, 1 part of reductant-oxidant, 1-3 part(s) of dispersant, 5 parts of silver, 1 part of carbon, 55 parts of graphene oxide, 40 parts of thermoplastic elastomer and 0.2-1 part of lubricant;
   wherein the surfactant is selected from sodium dodecyl benzene sulfonate, sodium dodecyl sulfate, hexadecyl trimethyl ammonium bromide, butynediol diethoxy ether and polyvinylpyrrolidone; the dispersant is selected from polyethylene glycol octylphenyl ether, ethylene bis-stearamide and organic silicone oil; and the thermoplastic elastomer is selected from urethane, olefin, amide, diene and organic silicon thermoplastic elastomer.

2. A connector shielding shell, which is made from the electromagnetic shielding material of claim 1.

3. An electromagnetic shielding material comprising raw materials in part by weight: 1 part of surfactant, 1 part of coupling agent, 1 part of reductant-oxidant, 1-3 part(s) of dispersant, 5 parts of silver, 1 part of carbon, 47-50 parts of graphene oxide, 40 parts of thermoplastic elastomer and 0.2-1 part of lubricant;
   wherein the surfactant is selected from sodium dodecyl benzene sulfonate, sodium dodecyl sulfate, hexadecyl trimethyl ammonium bromide, butynediol diethoxy ether and polyvinylpyrrolidone; the dispersant is selected from polyethylene glycol octylphenyl ether, ethylene bis-stearamide and organic silicone oil; and the thermoplastic elastomer is selected from urethane, olefin, amide, diene and organic silicon thermoplastic elastomer.

4. A connector shielding shell, which is made from the electromagnetic shielding material of claim 3.

5. A cable comprising:
   an outer sheath;
   an inner sheath; and
   an outer shielding layer disposed between the outer sheath and the inner sheath;
   wherein the inner sheath includes a differential signal cable in an interior of the inner sheath;
   wherein the outer shielding layer employs plastic materials synthesized by using graphene oxide;
   wherein the outer shielding layer is prepared from raw materials in part by weight: 1 part of surfactant, 1 part of coupling agent, 1 part of reductant-oxidant, 1-3 part(s) of dispersant, 5 parts of silver, 1 part of carbon, 55 parts of graphene oxide, 40 parts of thermoplastic elastomer and 0.2-1 part of lubricant;
   wherein the surfactant is selected from sodium dodecyl benzene sulfonate, sodium dodecyl sulfate, hexadecyl trimethyl ammonium bromide, butynediol diethoxy ether and polyvinylpyrrolidone; the dispersant is selected from polyethylene glycol octylphenyl ether, ethylene bis-stearamide and organic silicone oil; and the thermoplastic elastomer is selected from urethane, olefin, amide, diene and organic silicon thermoplastic elastomer.

6. The cable of claim 5, wherein the inner sheath employs at least one of aluminum foil and mylar.

7. The cable of claim 5, wherein the outer sheath is made from at least one of PVC, TPE, and TPU materials.

8. The cable of claim 5, wherein the inner sheath further comprises a power cable and a control cable in the interior of the inner sheath; the differential signal cable, the power cable and the control cable each comprise a conductor and an insulator wrapping the conductor, respectively, further wherein the differential signal cable further comprises an inner shielding layer that wraps the insulator.

9. A cable comprising:
an outer sheath;
an inner sheath; and
an outer shielding layer disposed between the outer sheath and the inner sheath;
wherein the inner sheath includes a differential signal cable in an interior of the inner sheath;
wherein the outer shielding layer employs plastic materials synthesized by using graphene oxide;
wherein the outer shielding layer is prepared from raw materials in part by weight: 1 part of surfactant, 1 part of coupling agent, 1 part of reductant-oxidant, 1-3 part(s) of dispersant, 5 parts of silver, 1 part of carbon, 47-50 parts of graphene oxide, 40 parts of thermoplastic elastomer and 0.2-1 part of lubricant;
wherein the surfactant is selected from sodium dodecyl benzene sulfonate, sodium dodecyl sulfate, hexadecyl trimethyl ammonium bromide, butynediol diethoxy ether and polyvinylpyrrolidone; the dispersant is selected from polyethylene glycol octylphenyl ether, ethylene bis-stearamide and organic silicone oil; and the thermoplastic elastomer is selected from urethane, olefin, amide, diene and organic silicon thermoplastic elastomer.

10. The cable of claim 9, wherein the inner sheath employs at least one of aluminum foil and mylar.

11. The cable of claim 9, wherein the outer sheath is made from at least one of PVC, TPE, and TPU materials.

12. The cable of claim 9, wherein the inner sheath further comprises a power cable and a control cable in the interior of the inner sheath; the differential signal cable, the power cable and the control cable each comprise a conductor and an insulator wrapping the conductor, respectively, further wherein the differential signal cable further comprises an inner shielding layer that wraps the insulator.

* * * * *